US010990010B2

(12) United States Patent
Irisawa et al.

(10) Patent No.: US 10,990,010 B2
(45) Date of Patent: Apr. 27, 2021

(54) PHOTOSENSITIVE RESIN COMPOSITION AND ETCHING PROCESS

(71) Applicant: MITSUBISHI PAPER MILLS LIMITED, Tokyo (JP)

(72) Inventors: Munetoshi Irisawa, Tokyo (JP); Norihiko Gokan, Tokyo (JP); Kunihito Kajiya, Tokyo (JP); Yuji Toyoda, Tokyo (JP); Kunihiro Nakagawa, Tokyo (JP)

(73) Assignee: MITSUBISHI PAPER MILLS LIMITED, Tokyo (JP)

( * ) Notice: Subject to any disclaimer, the term of this patent is extended or adjusted under 35 U.S.C. 154(b) by 6 days.

(21) Appl. No.: 15/556,047

(22) PCT Filed: Mar. 16, 2016

(86) PCT No.: PCT/JP2016/058318
§ 371 (c)(1),
(2) Date: Sep. 6, 2017

(87) PCT Pub. No.: WO2016/158416
PCT Pub. Date: Oct. 6, 2016

(65) Prior Publication Data
US 2018/0046079 A1 Feb. 15, 2018

(30) Foreign Application Priority Data

Apr. 3, 2015 (JP) .............................. JP2015-076433
Dec. 24, 2015 (JP) .............................. JP2015-251083

(51) Int. Cl.
*G03F 7/031* (2006.01)
*C03C 15/00* (2006.01)
*G03F 7/40* (2006.01)
*G03F 7/038* (2006.01)
*G03F 7/039* (2006.01)
*G03F 7/20* (2006.01)
*G03F 7/32* (2006.01)

(52) U.S. Cl.
CPC .............. *G03F 7/031* (2013.01); *C03C 15/00* (2013.01); *G03F 7/038* (2013.01); *G03F 7/039* (2013.01); *G03F 7/0388* (2013.01); *G03F 7/20* (2013.01); *G03F 7/322* (2013.01); *G03F 7/40* (2013.01)

(58) Field of Classification Search
CPC .......... G03F 7/031; G03F 7/40; G03F 7/0388; G03F 7/322; G03F 7/20; G03F 7/039; G03F 7/038; C03C 15/00
See application file for complete search history.

(56) References Cited

U.S. PATENT DOCUMENTS

| | | | |
|---|---|---|---|
| 4,451,329 A | 5/1984 | Batchelor et al. | |
| 6,359,759 B1 * | 3/2002 | Congdon | ............ G11B 5/6005 360/294.7 |
| 2001/0034105 A1 * | 10/2001 | Carlson | ............ H01L 27/14601 438/380 |
| 2010/0278931 A1 * | 11/2010 | Ashton | ................ A61K 9/0097 424/501 |
| 2012/0250268 A1 * | 10/2012 | Ito | ........................ C08G 18/348 361/748 |
| 2013/0085208 A1 | 4/2013 | Norikoshi et al. | |
| 2014/0069702 A1 * | 3/2014 | Sekito | .................... H05K 3/287 174/258 |
| 2014/0308613 A1 * | 10/2014 | Higuchi | ................. C08G 59/42 430/280.1 |
| 2015/0014029 A1 | 1/2015 | Iwayama et al. | |

FOREIGN PATENT DOCUMENTS

| | | |
|---|---|---|
| CN | 103492949 | 1/2014 |
| JP | 2001-209175 | 8/2001 |
| JP | 2005-164877 | 6/2005 |
| JP | 2007-128052 | 5/2007 |
| JP | 2007-316247 | 12/2007 |
| JP | 2009-265389 | 11/2009 |
| JP | 2011-43564 | 3/2011 |
| JP | 2013-117682 | 6/2013 |
| TW | 201418882 | 5/2014 |

(Continued)

OTHER PUBLICATIONS

English abstract of JP 2001209175a from Chemical abstracts, Accession No. 2001:380921, CAN 135:12109, CAPLUS obtaind from SciFinder database, dated 2001, 3 pages (Year: 2001).*
English translation of JP, 2011-043564, A (2011) from machine translation from AIPN Japan Patent Office National Center for Industrial Property Information and Training, generated Apr. 5, 2019, 25 pages. (Year: 2011).*
English translation of TW 201418882 from Espacenetin Family for WO2014024804 a1 (translation starts on 1/13 page, generated Apr. 8, 2019, 17 pages. (Year: 2014).*
English Translation of WO 2006057385 a (2006 year) generated at WIP Patentscope https://patentscope.wipo.int/search/en/search.jsf . generated Apr. 10, 2019, 25 pages. (Year: 2006).*

(Continued)

*Primary Examiner* — Cynthia Hamilton
(74) *Attorney, Agent, or Firm* — Wenderoth, Lind & Ponack, L.L.P.

(57) ABSTRACT

The present invention is a photosensitive resin composition to be used in an etching process in which an etching treatment is conducted with an etching solution containing hydrofluoric acid or ammonium fluoride. The photosensitive resin composition comprises at least (A) an acid-modified epoxy acrylate, (B) a photopolymerization initiator, (C) a blocked isocyanate compound, and (D) a filler. The etching process involves forming a photosensitive resin layer comprising said photosensitive resin composition, on at least one surface of a substrate; exposing and then developing the photosensitive resin layer; baking the photosensitive layer; and conducting an etching treatment with an etching solution containing hydrofluoric acid or ammonium fluoride.

5 Claims, No Drawings

(56) References Cited

FOREIGN PATENT DOCUMENTS

| WO | 2006/057385 | 6/2006 |
| WO | 2012/147745 | 11/2012 |

OTHER PUBLICATIONS

ZFR-1185 from Sci Finder database obtained Apr. 10, 2019, CAS Registry No. 916584-75-3, 2 pages (Year: 2019).*
"Hydrogen Fluoride/ Hodrfluoric Acid: Systemic agent". CDC—the Emergency Response Safety and Health Database, from The National Institute for Occupational Safety and Health, date May 2011, 10 pages. (Year: 2011).*
International Search Report dated May 31, 2016 in International Application No. PCT/JP2016/058318.
Extended European Search Report dated Aug. 20, 2018 in European Application No. 16772299.0.
Office Action dated Dec. 25, 2019 in corresponding Chinese Patent Application No. 201680017653.8 with English translation.

* cited by examiner

PHOTOSENSITIVE RESIN COMPOSITION AND ETCHING PROCESS

TECHNICAL FIELD

The present invention relates to a photosensitive resin composition which has excellent resistance to an etching solution containing hydrofluoric acid or ammonium fluoride, as well as an etching process utilizing said photosensitive resin composition.

BACKGROUND ART

There are some cases where an etching solution containing hydrofluoric acid or ammonium fluoride is used in etching a substrate such as glass, silicone and titanium substrates.

For example, a process for forming a pattern on a glass substrate comprises steps of:

coating a photosensitive resin composition on a glass substrate, and exposing the photosensitive resin-coated glass substrate through a photomask with a desired pattern to cure the photosensitive resin composition;

removing non-exposed portions (un-cured portions) by development to form a resist pattern consisting of the photosensitive resin composition on the glass substrate; and spray-blowing an etching solution containing hydrofluoric acid or ammonium fluoride onto the bared glass substrate portions to dissolve the glass of said portions, whereby a pattern is finally formed on the glass substrate.

A negative-type photosensitive resin composition has been conventionally used as a photosensitive resin composition used in an etching process using an etching solution containing hydrofluoric acid or ammonium fluoride.

For example, as a photocurable resist material which is resistant to be peeled off from a glass substrate, there is known a resist material containing an acrylic resin having ethylenic unsaturated double bonds at the side chains thereof, a polysilane and a photoinitiator (see Patent Document 1). Further, as a photosensitive resin composition having excellent adhesiveness to a glass substrate, there is known a photosensitive resin composition comprising a specific carboxyl group-containing binder resin, a photopolymerizable monomer and a specific organosilane compound (see Patent Document 2). Furthermore, as a UV-curable resist composition, there is known a resist composition containing an acid-containing resin, an unsaturated compound, a photoinitiator, an alkoxysilane compound, an inorganic filler, and the like (see Patent Document 3).

However these known resin compositions have problems that with only components contained therein, they have insufficient resistance to an etching solution containing hydrofluoric acid or ammonium fluoride, and as a result, a resist pattern is peeled off from a glass substrate when the glass substrate is immersed in said etching solution.

Another photosensitive resin composition is known which contains an alkali-soluble resin, an ethylenic unsaturated bond-containing photopolymerizable compound, a blocked poly isocyanate and a filler (Patent Document 4).

However this known photosensitive resin composition has problems that with only combination of components contained therein, it has insufficient resistance to a highly concentrated etching solution containing 15 mass % or more of hydrofluoric acid or ammonium fluoride, and as a result, there were some cases where a resist pattern is peeled off from a glass substrate when the glass substrate is immersed in said highly concentrated etching solution.

PRIOR ART DOCUMENTS

Patent Documents

[Patent Document 1] Japanese Patent Application Laid-Open No. 2005-164877
[Patent Document 2] Japanese Patent Application Laid-Open No. 2007-316247
[Patent Document 3] Japanese Patent Application Laid-Open No. 2007-128052
[Patent Document 4] Japanese Patent Application Laid-Open No. 2013-117682

SUMMARY OF THE INVENTION

Problems to be Solved by the Invention

The object of the present invention is to provide a photosensitive resin composition which has excellent resistance to an etching solution containing highly concentrated hydrofluoric acid or ammonium fluoride, as well as an etching process utilizing said photosensitive resin composition.

Means for Solving the Problems

Above mentioned object can be solved by the following means.

(1) A photosensitive resin composition to be used in an etching process in which an etching treatment is conducted with an etching solution containing hydrofluoric acid or ammonium fluoride, characterized in that the photosensitive resin composition comprises at least (A) an acid-modified epoxy acrylate, (B) a photopolymerization initiator, (C) a blocked isocyanate compound, and (D) a filler.

(2) The photosensitive resin composition recited in above (1), wherein the acid-modified epoxy acrylate (A) is a compound produced by reacting at least (a1) an epoxy resin, (a2) at least one compound selected from the group of acrylic acid and methacrylic acid, and (a3) at least one compound selected from the group of a carboxylic acid-containing compound and an anhydride thereof; and said epoxy resin (a1) is a bisphenol A-type epoxy resin.

(3) The photosensitive resin composition recited in claim 1 or 2, wherein the acid-modified epoxy acrylate (A) is a compound produced by reacting at least (a1) an epoxy resin, (a2) at least one compound selected from the group of acrylic acid and methacrylic acid, and (a3) at least one compound selected from the group of a carboxylic acid-containing compound and an anhydride thereof; and said compound (a3) is at least one selected from the group of succinic acid and succinic anhydride.

(4) The photosensitive resin composition recited in any of above (1) to (3), wherein the blocked isocyanate compound (C) is 1,6-hexamethylene diisocyanate which has been blocked with methylethyl ketoxime.

(5) The photosensitive resin composition recited in any of above (1) to (4), wherein the filler (D) is talc.

(6) An etching process characterized by comprising the steps of:

forming a photosensitive resin layer comprising a photosensitive resin composition recited in any of above (1) to (5), on at least one surface of a substrate;

exposing and then developing the photosensitive resin layer;

baking the photosensitive resin layer; and conducting an etching treatment with an etching solution containing hydrofluoric acid or ammonium fluoride.

Advantageous Effects of the Invention

The photosensitive resin composition is initially exposed to form a pattern form of cured film, since it contains (A) an acid modified epoxy acrylate (sometimes referred to as "component (A)") and (B) a polymerization initiator (sometimes referred to as "component (B)"). Then alkali development is performed to form a resist pattern, followed by baking to give a strong bonding which is formed by the thermal crosslinking reaction of an isocyanate group generated from a blocked isocyanate group existing in (C) a blocked isocyanate compound (sometimes referred to as "component (C)"), with a carboxylic group and a hydroxyl group existing in the component (A), thereby extremely increasing the resistance to an etching solution containing hydrofluoric acid or ammonium fluoride. (D) a filler (sometimes referred to as "component (D)") strengthens the film to prevent the etching solution containing hydrofluoric acid or ammonium fluoride from penetrating into the film.

The photosensitive resin composition of the present invention, comprising the components (A) to (D), has excellent resistance to an etching solution containing hydrofluoric acid or ammonium fluoride, and attains an effect that it is resistant to be peeled off from a substrate even when etched with a highly concentrated etching solution containing 15 mass % or more of hydrofluoric acid or ammonium fluoride.

EMBODIMENTS FOR CARRYING OUT THE INVENTION

Hereinafter, the present invention will be described in detail.

The photosensitive resin composition of the present invention comprises at least (A) an acid-modified epoxy acrylate, (B) a photopolymerization initiator, (C) a blocked isocyanate compound, and (D) a filler.

The preferable example of the component (A) is a compound produced by reacting at least (a1) an epoxy resin, (a2) at least one compound selected from the group of acrylic acid and methacrylic acid, and (a3) at least one compound selected from the group of a carboxylic acid-containing compound and an anhydride thereof. This compound can be synthesized, for example, by adding to the epoxy resin (a1), at least one compound (a2) selected from the group of acrylic acid and methacrylic acid, and then the compound (a3).

As the epoxy resin (a1), there can be included a phenol novolak type, a cresol novolak type, a bisphenol A type, a bisphenol F type, a trisphenol type, a tetraphenol type, a phenol-xylylene type, a glycidyl ether type or their halogenated epoxy resins.

As the carboxylic acid-containing compound in the compound (a3), there can be used maleic acid, succinic acid, itaconic acid, phthalic acid, tetrahydrophthalic acid, hexahydrophthalic acid, endomethylenetetrahydrophthalic acid, methylendomethylenetetrahydrophthalic acid, chlorendic acid, methyltetrahydrophthalic acid, trimellitic acid, pyromellitic acid, benzophenonetetracarboxylic acid, and the like. As the acid anhydride of the carboxylic acid-containing compound, there can be included anhydrides of the above mentioned carboxylic acid-containing compounds.

The resistance to an etching solution containing hydrofluoric acid or ammonium fluoride is further improved, when the epoxy resin (a1) in the component (A) is a bisphenol A type epoxy resin or when the compound (a3) in the component (A) is at least one selected from the group of succinic acid and succinic anhydride.

The acid value of the component (A) influences the alkali developing speed, resist peeling speed and softness of the photosensitive resin layer, and the like. The acid value is preferably 40 to 120 mg KOH/g. When the acid value is less than 40 mg KOH/g, alkali developing time tends to become longer, while when it exceeds 120 mg KOH/g, the adhesiveness of a photosensitive resin to a substrate to be treated sometimes worsens.

The mass average molecular weight of the component (A) is preferably 3,000 to 15,000. If the mass average molecular weight is less than 3,000, it sometimes becomes difficult to form a film of a pre-cured photosensitive resin composition. On the other hand, if it exceeds 15,000, the solubility of the resin in an alkali developing solution tends to deteriorate.

As the component (B), the following compounds can be exemplified.

aromatic ketones such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 2-benzyl-2-dimethylamino-1-(4-morpholinophenyl)-butanone-1,2-methyl-1-[4-(methylthio)phenyl]-2-morpholino-propanone-1; quinones such as 2-ethylanthraquinone, phenanthrenequinone, 2-tert-butylanthraquinone, octamethylanthraquinone, 1,2-benzanthraquinone, 2,3-benzanthraquinone, 2-phenyl-anthraquinone, 2,3-diphenylanthraquinone, 1-chloro-anthraquinone, 2-methylanthraquinones, 1,4-naphthoquinone, 9,10-phenanthraquinone, 2-methyl-1,4-naphthoquinone, 2,3-dimethylanthraquinone;

benzoin ether compounds such as benzoin methyl ether, benzoin ethyl ether, benzoin phenyl ether;

benzoin compounds such as benzoin, methylbenzoin, ethylbenzoin;

benzyl derivatives such as benzyl dimethyl ketal;

2,4,5-triarylimidazole dimers such as 2-(o-chlorophenyl)-4,5-diphenylimidazole dimer, 2-(o-chlorophenyl)-4,5-di(methoxyphenyl) imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer;

acridine derivatives such as 9-phenylacridine, 1,7-bis (9,9'-acridinyl) heptane;

N-phenylglycine, N-phenylglycine derivatives, and coumarin compounds.

In the above mentioned 2,4,5-triarylimidazole dimer, corresponding aryl groups, which may be substituted, in the two 2,4,5-triarylimidazoles may be identical with each other to give a symmetric compound or may be different from each other to give an asymmetric compound. Another example of the component (B) is a combination of a thioxanthone compound and a tertiary amine such as a combination of diethylthioxanthone and dimethylammobenzoic acid. These are used alone or in combination of two or more.

The component (C) is a compound whose isocyanate group is protected by a blocking agent, and it can be produced by reacting a blocking agent with an isocyanate group of an isocyanate compound. The blocked isocyanate compound is a compound which is stable at a normal temperature, but generates an isocyanate group due to the cleavage of the blocking agent upon heating under certain constant conditions.

As the blocking agent, following compounds are exemplified.

phenolic compounds such as phenol, cresol, p-ethylphenol, p-tert-butylphenol;

alcohols such as ethanol, butanol, ethylene glycol, methyl cellosolve, benzyl alcohol;

active methylenes such as diethyl malonate, ethyl acetoacetate;

acid amides such as acetanilide, acetamide;

imides; amines; imidazoles; pyrazoles; ureas; carbamic acids; imines;

oximes such as formaldehyde oxime, acetaldoxime, acetoxime, methylethyl ketoxime, diacetylmonooxime, cyclohexanone oxime;

mercaptans;

sulfites such as sodium bisulfite, potassium bisulfite;

lactams.

As the blocking agent, methylethyl ketoxime is preferable from the viewpoint of normal temperature storage stability and crosslinking ability.

As the isocyanate compound, following compounds are exemplified.

2,6-tolylene diisocyanate, 2,4-tolylene diisocyanate, xylylene diisocyanate, 1,6-hexamethylene diisocyanate, 4,4'-diphenylmethane diisocyanate, 4,4'-methylene bis-(cyclohexyl isocyanate), trimethylhexamethylene diisocyanate, isophorone diisocyanate, naphthalene diisocyanate, tolidine diisocyanate, lysine diisocyanate, methylcyclohexane-2,4-diisocyanate, methylcyclohexane-2,6-diisocyanate, 1,3-(isocyanatomethyl) cyclohexane, dimer acid diisocyanate, and their prepolymers such as adduct, biuret, isocyanurate.

As the isocyanate compound, 1,6-hexamethylene diisocyanate is preferable from the viewpoint of the adhesiveness of a photosensitive resin composition layer to a substrate, and developability.

As the component (D), there can be included silica, talc, quartz, alumina, barium sulfate, barium titanate, clay, magnesium carbonate, calcium carbonate, aluminum oxide, aluminum hydroxide, titanium oxide, mica and the like. These fillers' average particle diameter D50 measured by laser diffraction method is preferably 0.01 µm to 20 µm, and more preferably 0.1 µm to 10 µm. If the particle dimeter is less than 0.01 µm, it is difficult to pulverize a filler, resulting in increase in the cost of a filler product. If the particle diameter exceeds 20 µm, a resist pattern is liable to have a rough linear edge. As the component (D), talc is preferable from the view point of the resistance to an etching solution containing hydrofluoric acid or ammonium fluoride.

The photosensitive resin composition of the present invention may optionally contain one or more components other than above components (A) to (D). Such components include a crosslinkable monomer, a sensitizer, a thermal polymerization inhibitor, a plasticizer, a colorant (dye and pigment), a light-induced colorant, a heat-induced coloring inhibitor, a defoamer, a flame retardant, a stabilizer, an adhesive additive, a leveling agent, a peeling accelerator, an antioxidant, a perfume, a thermal hardening agent, a water repellent and an oil repellent, and the like. Each of them may be contained in an amount of about 0.01 to 20 mass %. One component may be used alone, or two or more components may be used in combination.

If necessary, the photosensitive resin composition of the present invention may contain following solvents singly or in combination.

alcohols such as methanol, ethanol, n-propanol, 2-butanol, n-hexanol;

ketones such as acetone, 2-butanone;

esters such as ethyl acetate, butyl acetate, n-amyl acetate, methyl sulfate, ethyl propionate, dimethyl phthalate, ethyl benzoate;

aromatic hydrocarbons such as toluene, xylene, benzene, ethylbenzene;

ethers such as tetrahydrofuran, diethyl ether, ethylene glycol monomethyl ether, ethylene glycol monoethyl ether, 1-methoxy-2-propanol;

N,N-dimethylformamide and dimethylsulfoxide.

In the photosensitive resin composition of the present invention, the amount of the component (A) is preferably 35 to 55 mass % and more preferably 40 to 50 mass % relative to the total amount of the components (A), (B), (C) and (D). When the amount of the component (A) is less than 35 mass %, film formation may be deteriorated. When the amount of the component (A) exceeds 55 mass %, the resistance to an etching solution containing hydrofluoric acid or ammonium fluoride may decrease.

The amount of the component (B) is preferably 0.1 to 10 mass % and more preferably 0.2 to 5 mass % relative to the total amount of the components (A), (B), (C) and (D). When the amount of the compound (B) is less than 0.1 mass %, photopolymerizability tends to be insufficient. When it exceeds 10 mass %, there is a tendency that the absorption at the surface of a photosensitive resin layer increases during exposure, resulting in insufficient photocrosslinking inside the photosensitive resin layer.

The amount of the component (C) is preferably 5 to 25 mass % and more preferably 10 to 20 mass % relative to the total amount of the components (A), (B), (C) and (D). When the amount of the component (C) is less than 5 mass %, a photosensitive layer after baking may have insufficient resistance to an etching solution containing hydrofluoric acid or ammonium fluoride. When it exceeds 25 mass %, there is a tendency that photo-curing becomes insufficient, which causes insufficient resolution.

The amount of the component (D) is preferably 20 to 45 mass % and more preferably 25 to 40 mass % relative to the total amount of the components (A), (B), (C) and (D). If the amount of the component (D) is less than 20 mass %, edge fusion tends to occur when a photosensitive resin composition is made into a dry film. If it exceeds 45 mass %, there are some cases where the component (D) may remain in a substrate after resist peeling, resulting in residual defects.

In the etching process of the present invention, a photosensitive resin composition is initially coated on a substrate and dried to form a photosensitive resin layer containing a photosensitive resin composition. Alternately, a substrate may be pasted together with a photosensitive film (dry film) in which a photosensitive resin layer has been previously formed on a carrier film. Thereafter, exposure is conducted through a pattern to cure exposed portions. Subsequently, alkali development is carried out to remove portions which are unnecessary for a resist pattern (non-exposed portions), thereby forming a resist pattern consisting only of a cured photosensitive resin layer. As an alkali developing solution, for example, an aqueous solution of an alkali metal carbonate can be used. After alkali development, heating (baking) treatment is performed on the resist pattern, followed by etching with an etching solution containing hydrofluoric acid or ammonium fluoride. Thereafter, resist peeling can be carried out.

As the substrate, there can be included glass, ceramics, silver oxide, silicon, germanium, tantalum, a semiconductor substrate, quartz, titanium and the like.

The heating (baking) treatment of the resist pattern is carried out for the purpose of improving the adhesiveness of the photosensitive resin layer to the substrate, improving the resistance to an etching solution containing hydrofluoric acid or ammonium fluoride, or the like. The heating temperature is preferably not less than the temperature at which the blocking agent is cleaved. It is preferably 90 to 250° C., and more preferably 110 to 200° C. If the temperature is lower than 90° C., crosslinking reaction proceeds slowly, and if it exceeds 250° C., the decomposition of other components may occur. The heating time is preferably 10 to 90 minutes.

The carrier film is preferably a transparent film which transmits ultraviolet rays. For example, there can be used polypropylene, polyethylene, polyester, polyvinyl alcohol and the like. Among them, a polyethylene terephthalate film has advantages in lamination suitability, peelability, light transparency and refractive index. The polyethylene terephthalate film is extremely utilizable because it is inexpensive, has embrittlement resistance, excellent solvent resistance and high tensile strength. The thickness of the carrier film is preferably 1 to 100 µm.

As a photosensitive resin layer forming method in which a photosensitive resin layer is coated on a substrate or a carrier film and dried, there can be used various methods using a roll coater, a comma coater, a gravure coater, an air knife, a die coater, a bar coater or the like. The thickness of the photosensitive resin layer is preferably 3 to 150 µm. When the thickness is less than 3 µm, there are some cases where it becomes difficult to coat the photosensitive resin layer on the substrate or to transfer the photosensitive resin layer from the carrier film to the substrate. When it exceeds 150 µm, there are some cases where the resolution of a resist pattern may deteriorate.

EXAMPLES

Hereinafter, the present invention will be described in more detail by examples, but the present invention is not limited to these examples.

Examples 1 to 13, Comparative Examples 1 to 3

The components shown in Tables 1 to 3 were mixed to obtain photosensitive resin compositions. In Table 1 to 3, the unit for the amount of the each component is parts by mass. Each of the resulting coating liquids was applied onto a polyethylene terephthalate (PET) film (trade name: R 310, thickness 25 µm, manufactured by Mitsubishi Plastics, Inc.) with a wire bar, and dried at 100° C. for 8 minutes to remove the solvent component, whereby photosensitive resin layers (dried film thickness: 60 µm) consisting of the photosensitive resin compositions of Examples 1 to 13 and Comparative Examples 1 to 3 were obtained on one surface of the PET film.

TABLE 1

| Components | | Example 1 | Example 2 | Example 3 | Example 4 | Example 5 | Example 6 | Example 7 |
|---|---|---|---|---|---|---|---|---|
| Component (A) | (A-1) | 55 | 55 | | 17 | | | |
| | (A-2) | 17 | | 35 | | 35 | 55 | |
| | (A-3) | | 17 | | 55 | | | |
| | (A-4) | | | 35 | | 35 | 17 | |
| | (A-5) | | | | | | | 46 |
| | (A-6) | | | | | | | |
| Component (B) | (B-1) | 3 | 3 | 3 | 3 | 3 | 3 | 3 |
| | (B-2) | 0.1 | 0.1 | 0.1 | 0.1 | 0.1 | 0.1 | 0.1 |
| Component (C) | (C-1) | | 20 | | 20 | 20 | 20 | 20 |
| | (C-2) | 20 | | | | | | |
| | (C-3) | | | 20 | | | | |
| Component (D) | (D-1) | 35 | | | | | | |
| | (D-2) | | 35 | | 35 | 35 | 35 | |
| | (D-3) | | | 35 | | | | |
| | (D-4) | | | | | | | 35 |
| Solvent | Methyl-ethyl ketone | 100 | 100 | 100 | 100 | 100 | 100 | 100 |

TABLE 2

| Components | | Example 8 | Example 9 | Example 10 | Example 11 | Example 12 | Example 13 | Comparative Example 1 | Comparative Example 2 |
|---|---|---|---|---|---|---|---|---|---|
| Component (A) | (A-1) | | | | | | | 55 | 55 |
| | (A-2) | | | | | | | | |
| | (A-3) | | | | | | | 17 | 17 |
| | (A-4) | | | | | | | | |
| | (A-5) | 46 | 46 | | 46 | 46 | 46 | | |
| | (A-6) | | | 46 | | | | | |
| Component (B) | (B-1) | 3 | 3 | 3 | 3 | 3 | 3 | 3 | 3 |
| | (B-2) | 0.1 | 0.1 | 0.1 | 0.1 | 0.1 | 0.1 | 0.1 | 0.1 |
| Component (C) | (C-1) | | | | 20 | 20 | 20 | 20 | |
| | (C-2) | 20 | | | | | | | |
| | (C-3) | | 20 | | | | | | 20 |
| Component (D) | (D-1) | | | | | | 35 | | |
| | (D-2) | | | | | 35 | | 35 | |
| | (D-3) | | | | 35 | | | | |
| | (D-4) | 35 | 35 | 35 | | | | | |

TABLE 2-continued

| Components | | Example 8 | Example 9 | Example 10 | Example 11 | Example 12 | Example 13 | Comparative Example 1 | Comparative Example 2 |
|---|---|---|---|---|---|---|---|---|---|
| Solvent | Methyl-ethyl ketone | 100 | 100 | 100 | 100 | 100 | 100 | 100 | 100 |

TABLE 3

| Components | | Comparative Example 3 |
|---|---|---|
| Component (E) | (E-1) | 35 |
| Component (B) | (B-1) | 3 |
| | (B-2) | 0.1 |
| Component (F) | (F-1) | 15 |
| | (F-2) | 15 |
| Component (C) | (C-1) | 15 |
| Component (D) | (D-1) | 20 |
| Solvent | Methyl-ethyl ketone | 100 |

In Tables 1 to 3, each of the components are as follows.
<Component (A)>

(A-1) Acid-modified epoxy acrylate KAYARAD (registered trademark) UXE-3024 (trade name, manufactured by Nippon Kayaku Co., Ltd., concentration 65 mass %, epoxy resin (a1): composite type)

(A-2) Acid-modified epoxy acrylate KAYARAD (registered trademark) CCR-1235 (trade name, manufactured by Nippon Kayaku Co., Ltd., concentration 62 mass %, epoxy resin (a1): cresol novolak type epoxy resin)

(A-3) Acid-modified epoxy acrylate KAYARAD (registered trademark) ZAR-1035 (trade name, manufactured by Nippon Kayaku Co., Ltd., concentration 65 mass %, epoxy resin (a1): bisphenol A type epoxy resin)

(A-4) Acid-modified epoxy acrylate KAYARAD(registered trademark) ZFR-1401H (trade name, manufactured by Nippon Kayaku Co., Ltd., concentration 62 mass %, epoxy resin (a1): bisphenol F type epoxy resin)

(A-5) Acid-modified epoxy acrylate obtained by reacting the epoxy resin (a1), the compound (a3), and acrylic acid in a molar ratio of 1:2:2, wherein the epoxy resin is a bisphenol A type epoxy resin (trade name: JER 828, manufactured by Mitsubishi Chemical Corporation) and the compound (a3) is succinic acid.

(A-6) Acid-modified epoxy acrylate obtained by reacting the epoxy resin (a1), the compound (a3), and acrylic acid in a molar ratio of 1:2:2, wherein the epoxy resin is a bisphenol A type epoxy resin (trade name: JER 828, manufactured by Mitsubishi Chemical Corporation) and the compound (a3) is phtalic acid.

<Component (B)>

(B-1) 2-(2'-chlorophenyl)-4,5-diphenylimidazole dimer
(B-2) 4,4'-bis(diethylamino) benzophenone <Component (C)>

(C-1) SUMIDUR(registered trademark) BL3175 (trade name, manufactured by Sumika Kobesutorou Urethane Co., Ltd., base: 1,6-hexamethylene diisocyanate, blocking agent: methyl ethyl ketoxime, concentration 75 mass %)

(C-2) DESMODUR(registered trademark) BL1100 (trade name, manufactured by Sumika Kobesutorou Urethane Co., Ltd., base: 2,6-tolylene diisocyanate, blocking agent: ε-caprolactam)

(C-3) DESMOTHERM(registered trademark) 2170 (trade name, manufactured by Sumika Kobestorou Urethane Co., Ltd., base: 4,4'-diphenylmethane diisocyanate, blocking agent: active methylene, concentration 70 mass %)

<Component (D)>

(D-1) Precipitating Barium Sulfate #100 (Sakai Chemical Industry Co., Ltd.)

(D-2) talc (trade name: LMS-200, manufactured by Fuji Talc Industrial Co., Ltd., average particle diameter 5 μm)

(D-3) silica (trade name: FB-3SDC, manufactured by Denki Kagaku Industrial Co., Ltd.)

(D-4) talc (trade name: SG95, manufactured by Nippon Talc Co., Ltd., average particle diameter 2.5 μm)

<(E) Alkali-Soluble Resin>

(E-1) component; Copolymerized resin (mass average molecular weight: 70000) obtained by copolymerizing methyl methacrylate/n-butyl acrylate/methacrylic acid in a mass ratio of 58/15/27

<(F) Photopolymerizable Compound Having Ethylenically Unsaturated Groups>

(F-1) 2,2'-bis-(4-methacryloxypentaethoxyphenyl) propane (Trade name: BPE-500, manufactured by Shin Nakamura Chemical Co., Ltd.)

(F-2) timethylolpropane triacrylate (trade name: TMP-A, manufactured by Kyoeisha Chemical Co., Ltd.)

Each of photosensitive resin layers containing the photosensitive resin compositions of above mentioned Examples 1 to 13 and Comparative Examples 1 to 3 was heat-pressed to a 2 mm thick substrate at 100° C. Subsequently, exposure was carried out with an ultra-high pressure mercury lamp through a photomask (line/space=500 μm/500 μm), followed by allowing to stand at room temperature for 10 minutes. After the PET film was peeled off, an aqueous solution containing 1 mass % sodium carbonate was sprayed on the surface of the photosensitive resin layer at 30° C. at a spray pressure of 0.1 MPa to remove the non-exposed portions, thereby completing development. After carrying out water washing at 20° C. at a spray pressure of 0.1 MPa and drying, baking treatment was carried out at 150° C. for 30 minutes.

The glass substrate on which the resist pattern has been formed as mentioned above, was immersed in a highly concentrated 20 mass % hydrofluoric acid aqueous solution (25° C.) for 40 minutes. In the photosensitive resin compositions of Examples 1 to 13, the peeling of the photosensitive resin layer did not occur and etching to a depth of 50 μm or more could be achieved. On the other hand, in the photosensitive resin compositions of Comparative Examples 1 to 3, the peeling of the photosensitive resin layer occurred, and satisfactory etching could not be achieved.

The comparison of Examples 1 to 4 reveals that with regard to Examples 2 and 4, in which the component (A) contains (A-3) an acid-modified epoxy acrylate obtained by using a bisphenol A type epoxy resin as the epoxy resin (a1); the component (C) is (C-1) 1,6-hexamethylene diisocyanate which has been blocked with methyl ethyl ketoxime, and the component (D) is talc (D-2), the peeling of the photosensitive resin layer did not occur even when immersion time was made longer and etching was performed to a depth of 100 μm or more.

The comparison of Examples 2, 4, 5 and 6 reveals that with regard to Example 2 and 4, in which the component (A) contains (A-3) an acid-modified epoxy acrylate obtained by using a bisphenol A type epoxy resin as the epoxy resin (a1), the peeling of the photosensitive resin layer did not occur even when immersion time was made longer and etching was performed to a depth of 100 μm or more.

The comparison of Examples 7, 8 and 9 reveals that with regard to Example 7, in which the component (C) is (C-1) 1,6-hexamethylene diisocyanate which has been blocked with methyl ethyl ketoxime, the peeling of the photosensitive resin layer did not occur even when immersion time was made longer and etching was performed to a depth of 100 μm or more.

The comparison of Examples 7 and 10 reveals that with regard to Example 7, in which the component (A) is (A-5) an acid-modified epoxy acrylate obtained by using succinic acid as the compound (a3), the peeling of the photosensitive resin layer did not occur even when immersion time was made longer and etching was performed to a depth of 100 μm or more.

The comparison of Examples 7, 11, 12 and 13 reveals that with regard to Example 7, in which the component (D) is (D-4) talc and with regard to Example 12, in which the component (D) is (D-2) talc, the peeling of the photosensitive resin layer did not occur even when immersion time was made longer and etching was performed to a depth of 100 μm or more.

INDUSTRIAL APPLICABILITY

The photosensitive resin composition of the present invention can be used as a resist in processing with an etching solution containing hydrofluoric acid or ammonium fluoride.

The invention claimed is:

1. An etching process comprising the sequential steps of:
    first, forming a photosensitive resin layer comprising a photosensitive resin composition comprising at least (A) an acid-modified epoxy acrylate, (B) a photopolymerization initiator, (C) a blocked 1,6-hexamethylene diisocyanate, and (D) alc, on at least one surface of a substrate;
    second, exposing and then developing the photosensitive resin layer to form a cured photosensitive resin layer having a resist pattern on the at least one surface of the substrate;
    third, baking the photosensitive resin layer, thereby crosslinking the cured photosensitive resin layer having the resist pattern, to form a crosslinked photosensitive resin layer having the resist pattern on the at least one surface of the substrate; and
    fourth, conducting an etching treatment on the at least one surface of the substrate having the crosslinked photosensitive resin layer having the resist pattern on the at least one surface of the substrate with an etching solution containing hydrofluoric acid in an amount of 15 mass % or more and not more than 20% mass,
    wherein the acid-modified epoxy acrylate (A) is a compound produced by reacting
        (a1) at least a bisphenol A epoxy resin,
        (a2) at least one compound selected from the group consisting of acrylic acid and methacrylic acid, and
        (a3) at least one compound selected from the group consisting of succinic acid and succinic anhydride.

2. The etching process recited in claim 1, wherein the blocked 1,6-hexamethylene diisocyanate (C) has been blocked with methylethyl ketoxime.

3. The etching process recited in claim 1, wherein the substrate is selected from the group consisting of glass, ceramics, silver oxide, silicon, germanium, tantalum, a semiconductor, quartz, and titanium.

4. An etching process comprising the sequential steps of:
    first, forming a photosensitive resin layer comprising a photosensitive resin composition comprising at least (A) an acid-modified epoxy acrylate, (B) a photopolymerization initiator, (C) a blocked 1,6-hexamethylene diisocyanate, and (D) talc, on at least one surface of a substrate;
    second, exposing and then developing the photosensitive resin layer to form a cured photosensitive resin layer having a resist pattern on the at least one surface of the substrate;
    third, baking the photosensitive resin layer, thereby crosslinking the cured photosensitive resin layer having the resist pattern, to form a crosslinked photosensitive resin layer having the resist pattern on the at least one surface of the substrate; and
    fourth, conducting an etching treatment on the at least one surface of the substrate having the crosslinked photosensitive resin layer having the resist pattern on the at least one surface of the substrate with an etching solution containing hydrofluoric acid in an amount of more than 0% mass and not more than 20% mass,
    wherein the acid-modified epoxy acrylate (A) is a compound produced by reacting
        (a1) at least a bisphenol A epoxy resin,
        (a2) at least one compound selected from the group consisting of acrylic acid and methacrylic acid, and
        (a3) at least one compound selected from the group consisting of succinic acid and succinic anhydride.

5. The etching process recited in claim 4, wherein the substrate is selected from the group consisting of glass, ceramics, silver oxide, silicon, germanium, tantalum, a semiconductor, quartz, and titanium.

* * * * *